US012130317B2

United States Patent
(12) Jidhage et al.

(10) Patent No.: US 12,130,317 B2
(45) Date of Patent: Oct. 29, 2024

(54) OVER THE AIR CALIBRATION OF AN ADVANCED ANTENNA SYSTEM

(71) Applicant: Telefonaktiebolaget LM Ericsson (publ), Stockholm (SE)

(72) Inventors: Henrik Jidhage, Hovås (SE); Stefan Johansson, Romelanda (SE); Tomas Lieback, Mölnlycke (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 218 days.

(21) Appl. No.: 17/784,031

(22) PCT Filed: Dec. 12, 2019

(86) PCT No.: PCT/EP2019/084816
§ 371 (c)(1),
(2) Date: Jun. 9, 2022

(87) PCT Pub. No.: WO2021/115599
PCT Pub. Date: Jun. 17, 2021

(65) Prior Publication Data
US 2023/0017555 A1 Jan. 19, 2023

(51) Int. Cl.
*G01R 29/08* (2006.01)
*G01R 29/10* (2006.01)

(52) U.S. Cl.
CPC ......... *G01R 29/0871* (2013.01); *G01R 29/10* (2013.01)

(58) Field of Classification Search
CPC .... G01R 29/0871; G01R 29/10; H04B 17/12; H04B 17/21; H01Q 3/267
See application file for complete search history.

(56) References Cited

U.S. PATENT DOCUMENTS

2005/0239419 A1* 10/2005 Fudaba .................. H04B 17/19 455/562.1
2017/0223559 A1* 8/2017 Kong .................. H04B 7/0413

FOREIGN PATENT DOCUMENTS

WO 2017/202469 A1 11/2017

OTHER PUBLICATIONS

International Search Report and Written Opinion dated Jul. 30, 2020 in International Application No. PCT/EP2019/084816 (15 pages).

(Continued)

*Primary Examiner* — Alvaro E Fortich
(74) *Attorney, Agent, or Firm* — Rothwell, Figg, Ernst & Manbeck, P.C.

(57) ABSTRACT

There is provided mechanisms for OTA calibration of an AAS. The AAS comprises N antenna branches, each of which comprises a respective subarray. The subarray of each antenna branch gives rise to a subarray antenna pattern extending over an angular interval. A method is performed by a test equipment. The method comprises obtaining measurement values for each of the antenna branches. At least one measurement value is obtained per each antenna branch. The method comprises determining one calibration factor value per antenna branch using the measurement values and taking the subarray antenna patterns into account. The method comprises applying the determined calibration factor values to the N antenna branches, thereby calibrating the AAS.

20 Claims, 14 Drawing Sheets

S102
Obtain amplitude and phase variation values for each subarray antenna gain pattern S104
Determine one calibration factor value per antenna branch using the amplitude and phase variation values S106
Provide built-in calibration function with determined calibration factor values

(56) References Cited

OTHER PUBLICATIONS

Park, H.G. et al., "Model based antenna array calibration for digital beamforming systems", IEEE, vol. 2, Apr. 22, 2003, XP010862554, pp. 867-870 (4 pages).
Salas-Natera, M.A. et al., "Procedure for Measurement, Characterization, and Calibration of Active Antenna Arrays", IEEE Transactions on Instrumentation and Measurement, vol. 62, No. 2, Feb. 2013, XP011484672, pp. 377-391 (15 pages).
Babur, G. et al., "Simple Calibration Technique for Phased Array Radar Systems", Progress In Electromagnetics Research M, vol. 55, Dec. 31, 2017, XP055644836, pp. 109-119 (11 pages).

* cited by examiner (a)

(b) (c)

OVER THE AIR CALIBRATION OF AN ADVANCED ANTENNA SYSTEM

CROSS REFERENCE TO RELATED APPLICATION(S)

This application is a 35 U.S.C. § 371 National Stage of International Patent Application No. PCT/EP2019/084816, filed Dec. 12, 2019.

TECHNICAL FIELD

Embodiments presented herein relate to a method, a test equipment, a computer program, and a computer program product for over the air (OTA) calibration of an advanced antenna system, or active antenna system, (AAS).

BACKGROUND

AAS commonly require control of phase and amplitude excitations of each antenna element or subarray. In most cases this implies that the AAS needs accurate calibration.

Assuming that the hardware of the AAS is stable over time, i.e. that the phase and amplitude of the radio chains will not vary over time, it might be sufficient that a one-time calibration is performed for the AAS. However, with a highly integrated building practice no connector interfaces suitable for calibration will be accessible and thus the calibration needs to be performed OTA.

However, in most cases the hardware of the AAS cannot be assumed stable over time. Therefore, the hardware might comprise a built-in calibration functionality to enable repeatable calibrations of AAS in field. This calibration capability might be based on, for instance, a built-in calibration network or by making use of mutual coupling between the antenna elements in the array aperture of the AAS. However, to ensure high accuracy of the built-in calibration, there is often a need for an accurate OTA calibration to calibrate the built-in calibration functionality.

FIG. 1 shows the horizontal embedded subarray antenna patterns and FIG. 2 shows the maximum gain deviation (per $\phi$ direction) for an AAS having 16 subarrays. It is desired to minimize the gain deviation between the subarray antenna patterns in order to minimize excitation errors which can cause e.g. poor sidelobes or incorrect beam shapes. The variation between the patterns in FIG. 1 can be explained by mutual coupling, edge effects, etc. and some variations need to be accepted given a certain antenna.

Different power amplifier output power will offset the curves and cause an increase gain deviation which needs to be calibrated. FIG. 3 shows Equivalent Isotropically Radiated Power (EIRP) levels assuming radio branches with 5 W nominal power and a random uniform power error of +/−1.5 dB i.e. 37 dBm+/−1.5 dB output power. FIG. 4 shows the corresponding maximum EIRP deviation (per $\phi$ direction). The deviation is increased in FIG. 4 compared to FIG. 2.

Current OTA calibration methods measure the EIRP in one direction e.g. $\phi=0°$. Measurement values are used to calculate a compensation factor. One example of the resulting EIRP patterns after amplitude corrections having been applied is presented in FIGS. 5 and 6. From these figures follows that there is no EIRP deviation in the calibration direction $\phi=0°$ (assuming no calibration error) and but potentially very large EIRP deviation in other directions.

Current OTA calibration methods are also sensitive to measurement errors, e.g. reflections in the antenna test range. FIGS. 7 and 8 show the EIRP after calibration assuming a random uniform quiet zone amplitude error of +/−1 dB. From these figures follows that it is possible that the EIRP deviation might increase in all directions.

It is noted that although the above examples in FIGS. 1-8 are performed for amplitude errors, corresponding results are obtainable for phase errors.

In view of the results shown in FIGS. 1-8 there is still a need for improved OTA calibration of an AAS.

SUMMARY

An object of embodiments herein is to provide efficient OTA calibration of an AAS, not suffering from the issues noted above, or at least where the above issues have been mitigated or reduced.

According to a first aspect there is presented a method for OTA calibration of an AAS. The AAS comprises N antenna branches, each of which comprises a respective subarray. The subarray of each antenna branch gives rise to a subarray antenna pattern extending over an angular interval. The method is performed by a test equipment. The method comprises obtaining measurement values for each of the antenna branches. At least one measurement value is obtained per each antenna branch. The method comprises determining one calibration factor value per antenna branch using the measurement values and taking the subarray antenna patterns into account. The method comprises applying the determined calibration factor values to the N antenna branches, thereby calibrating the AAS.

According to a second aspect there is presented a test equipment for OTA calibration of an AAS. The AAS comprises N antenna branches, each of which comprises a respective subarray. The subarray of each antenna branch gives rise to a subarray antenna pattern extending over an angular interval. The test equipment comprises processing circuitry. The processing circuitry is configured to cause the test equipment to obtain measurement values for each of the antenna branches. At least one measurement value is obtained per each antenna branch. The processing circuitry is configured to cause the test equipment to determine one calibration factor value per antenna branch using the measurement values and taking the subarray antenna patterns into account. The processing circuitry is configured to cause the test equipment to apply the determined calibration factor values to the N antenna branches, thereby calibrating the AAS.

According to a third aspect there is presented a test equipment for OTA calibration of an AAS. The AAS comprises N antenna branches, each of which comprises a respective subarray. The subarray of each antenna branch gives rise to a subarray antenna pattern extending over an angular interval. The test equipment comprises an obtain module configured to obtain measurement values for each of the antenna branches. At least one measurement value is obtained per each antenna branch. The test equipment comprises a determine module configured to determine one calibration factor value per antenna branch using the measurement values and taking the subarray antenna patterns into account. The test equipment comprises an apply module configured to apply the determined calibration factor values to the N antenna branches, thereby calibrating the AAS.

According to a fourth aspect there is presented a computer program for OTA calibration of an AAS, the computer program comprising computer program code which, when run on a test equipment, causes the test equipment to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously, these aspects provide efficient OTA calibration of the AAS.

Advantageously, the provided OTA calibration of the AAS does not suffer from the issues noted above.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional. Equations are given in both linear and decibel (dB) scale. It is well known in the literature how to, as such, transform between equations in linear scale on the one hand and equations in dB scale on the other hand.

Figure 9:
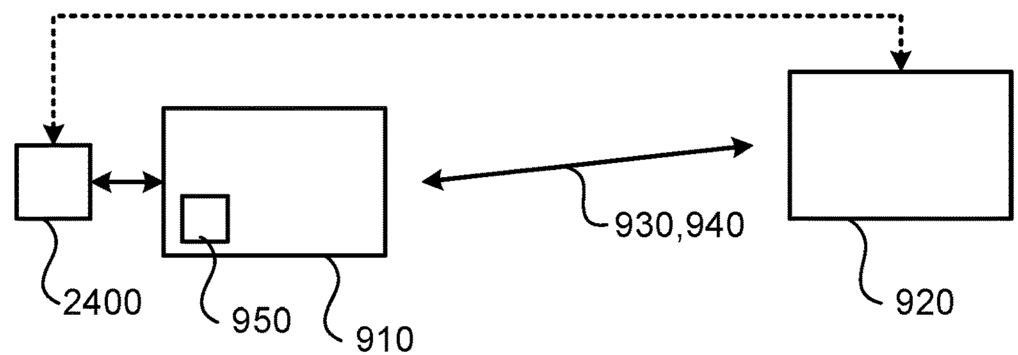
FIG. 9 is a schematic diagram illustrating a communications network according to embodiments.
Figure 9:
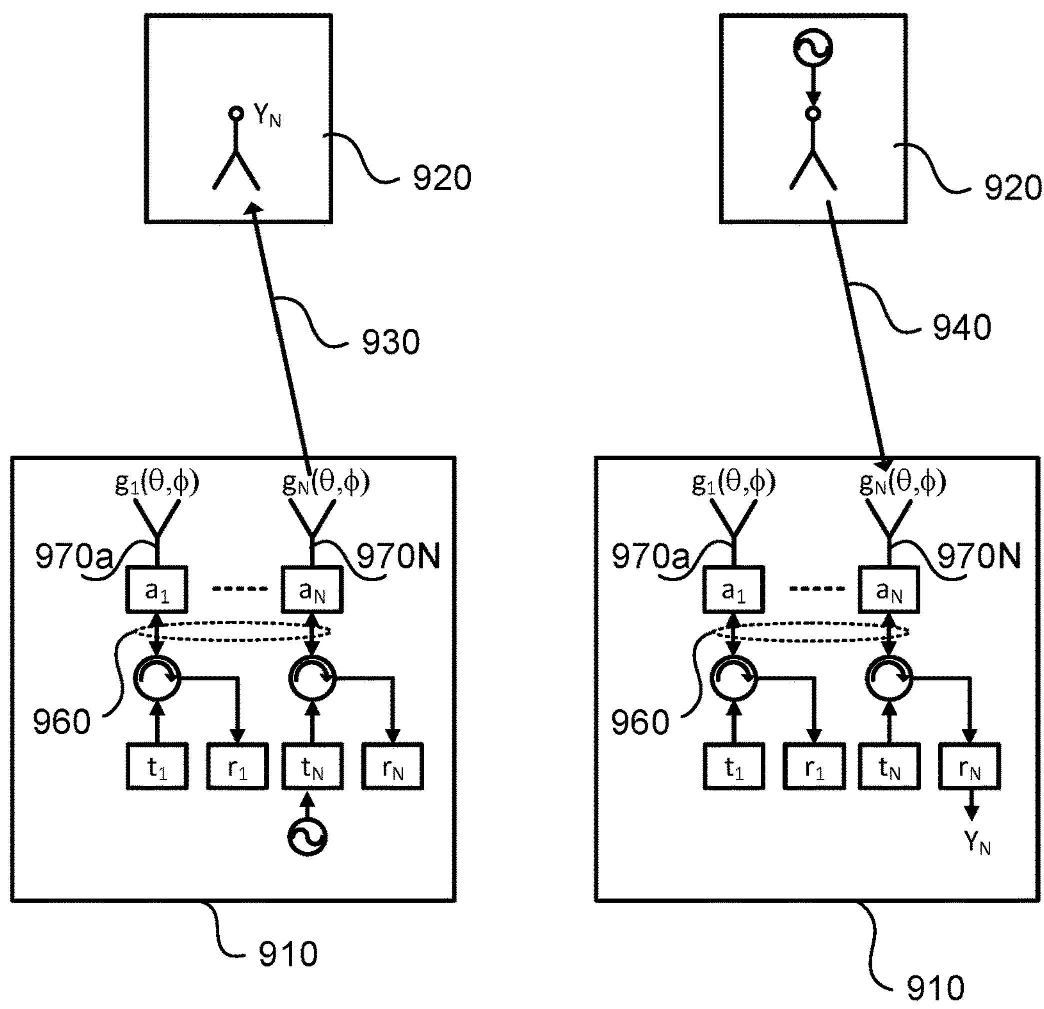

FIG. 9 at (a), (b), and (c) illustrate examples of schematic diagrams of a test environment 900, where embodiments presented herein can be applied. FIG. 9(*a*) shows a general overview of the test environment 900. The test environment 900 comprises an AAS 910. The AAS 910 is configured to transmit radio signals 930 to, and to receive radio signals 940 from, a remote signal transmitter and receiver 920. The remote signal transmitter and receiver 920 at least comprises a test range antenna for receiving radio signals 930 and for transmitting radio signals 940. The AAS 910 is operatively connected to a test equipment 2400. The test equipment 2400 is configured for OTA calibration of the AAS 910. The AAS 910 therefore comprises a calibration unit 950 for interaction with the test equipment 2400. In some scenarios the test equipment 2400 is also operatively connected to the remote signal transmitter and receiver 920 for receiving signal from the remote signal transmitter and receiver 920 as transmitted from the AAS 910 and/or for providing the remote signal transmitter and receiver 920 with signals to be transmitted towards the AAS 910.

FIG. 9(*b*) and FIG. 9(*c*) show more details of the test environment. FIG. 9(*b*) illustrates where the AAS 910 is in transmit mode and FIG. 9(*c*) illustrates where the AAS 910 is in receive mode. As illustrated in FIGS. 9(*b*) and 9(*c*), the AAS 910 comprises N antenna branches 960. Each of the N antenna branches 960 comprises a respective subarray 970*a*:970N. As in FIG. 9(*b*) and FIG. 9(*b*), in some examples, each subarray comprises at least one individual antenna element. The subarray 970*a*:970N of each antenna branch gives rise to a subarray antenna pattern 100; $g_1(\theta, \phi)$, $g_2(\theta, \phi)$, . . . , $g_N(\theta, \phi)$ extending over an angular interval (not shown).

Each of the N antenna branches 960 is coupled to a transmitter $t_n$ and a receiver $r_n$, where n=1 . . . N. The transmitter $t_n$ and the receiver $r_n$ are affected by calibration factor values $c_{n,dB}$, $c_{n,deg}$ as determined by the test equipment 2400.

Traditionally, measurement values $Y_n$ are used to calculate the compensation factor, $c_{n,dB}$ relative a desired reference level $Y_{ref}$, according to:

$$c_{n,dB}=Y_{ref,dB}-Y_{n,dB}$$

However, as noted above there is still a need for improved OTA calibration of an AAS 910. Embodiments, aspects, and examples, of how the test equipment 2400 might determine the calibration factor values $c_{n,dB}$, $c_{n,deg}$ will therefore be disclosed below.

In more detail, current calibration functions do not take amplitude and phase variations of the embedded subarray antenna patterns into account. As a result thereof, high gain deviations might occur for other directions than the calibrated direction (i.e., for other values of $\phi$ than for the value of $\phi$ for which the calibration was made; typically the calibration is made for $\phi$=0). Further, current calibration functions might be sensitive to, for example, quiet zone errors when calibration only is performed in one direction. At least some of the herein disclosed embodiments are therefore based on taking into account the effects of amplitude and phase variations of the individual embedded subarray antenna patterns to achieve proper calibration.

At least some of the herein disclosed embodiments therefore aim to reduce calibration errors due to the fact that the embedded antenna patterns of the individual antenna elements or subarray varies depending on its position in the full antenna array. If this is not properly handled this effect might cause significant residual errors in the calibration. At least some of the herein disclosed embodiments aim to reduce calibration errors due to a non-perfect quite zone for the OTA calibration, i.e. where disturbances caused by unwanted reflections in, for instance, an anechoic test chamber. At least some of the herein disclosed embodiments are therefore applicable to reduce calibration errors due to non-perfect quite zones for the OTA calibration.

The embodiments disclosed herein in particular relate to mechanisms for OTA calibration of an AAS 910. In order to obtain such mechanisms, there is provided a test equipment 2400, a method performed by the test equipment 2400, a computer program product comprising code, for example in the form of a computer program, that when run on a test equipment 2400, causes the test equipment 2400 to perform the method.

Figure 10:
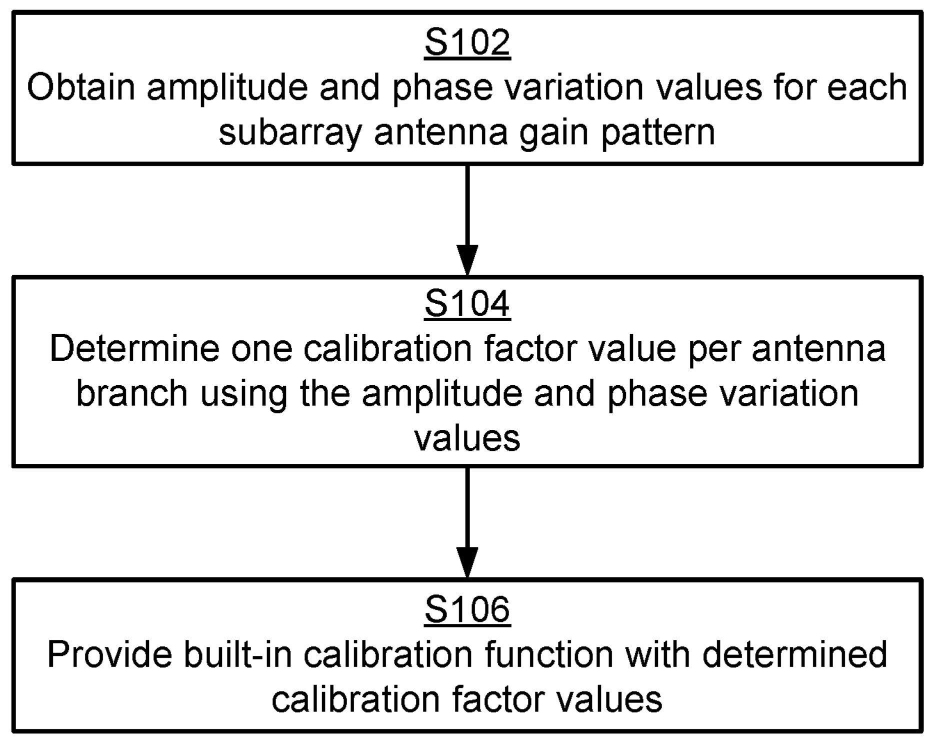
FIG. 10 is a flowchart of methods according to embodiments.

FIG. 10 is a flowchart illustrating embodiments of methods for OTA calibration of an AAS 910. The AAS 910 is assumed to comprise N antenna branches 960, each of which comprises a respective subarray 970*a*:970N. The subarray of each antenna branch gives rise to a subarray antenna pattern 100; $g_1(\theta, \phi)$, $g_2(\theta, \phi)$, . . . , $g_N(\theta, \phi)$ extending over an angular interval. The methods are performed by the test equipment 2400. The methods are advantageously provided as computer programs 2620.

S102: The test equipment 2400 obtains measurement values for each of the antenna branches, At least one measurement value is obtained per each antenna branch.

S104: The test equipment 2400 determines one calibration factor value $c_{n,dB}$, $c_{n,deg}$ per antenna branch using the measurement values and takes the subarray antenna patterns 100; $g_1(\theta, \phi)$, $g_2(\theta, \phi)$, . . . , $g_N(\theta, \phi)$ into account.

S106: The test equipment 2400 applies the determined calibration factor values to the N antenna branches 960. The test equipment 2400 thereby calibrates the AAS 910.

Advantageously, this method provides efficient OTA calibration of the AAS 910.

Advantageously, the provided OTA calibration of the AAS 910 does not suffer from the issues noted in the background section.

Embodiments relating to further details of OTA calibration of an AAS 910 as performed by the test equipment 2400 will now be disclosed.

There may be different types of measurement values. In some examples, the measurement values pertain to at least one of amplitude and phase.

The herein disclosed methods for OTA calibration of the AAS 910 are applicable to different types of scenarios. Embodiments, aspects, and examples relating to these scenarios will now be disclosed in turn.

According to a first scenario the subarray antenna patterns are known to the test equipment 2400 and all measurement values are obtained from one and the same direction within the angular interval.

Particularly, according to an embodiment, the subarray antenna patterns are known to the test equipment 2400, and, according to an embodiment, all measurement values are obtained from one and the same direction within the angular interval.

Further details of the first scenario will now be disclosed.

If the subarray antenna pattern, $g_n$, is known in the calibration direction(s), compensation might be performed taking the actual gain/phase into consideration. Particularly, according to an embodiment, the calibration factor value $c_{n,dB}$, $c_{n,deg}$ per antenna branch is determined as a function of a reference signal value given by $Y_{ref}$, the subarray antenna pattern for the subarray of antenna branch n in direction $\phi$ given by $g_n(\phi_{cal}{}^m)$, and a received signal value for antenna branch n in direction $\phi$ given by $Y_n(\phi_{cal}{}^m)$. In terms of amplitude variation, the calibration factor value for antenna branch n might thus be determined as:

$$c_{n,dB} = 20\log\left|\frac{Y_{ref} \cdot g_n(\phi_{cal}^m)}{Y_n(\phi_{cal}^m)}\right|$$

Further, in terms of phase variation, the calibration factor value for antenna branch n might be determined as:

$$c_{n,deg} = \arg\left(\frac{Y_{ref} \cdot g_n(\phi_{cal}^m)}{Y_n(\phi_{cal}^m)}\right)$$

Figure 1:
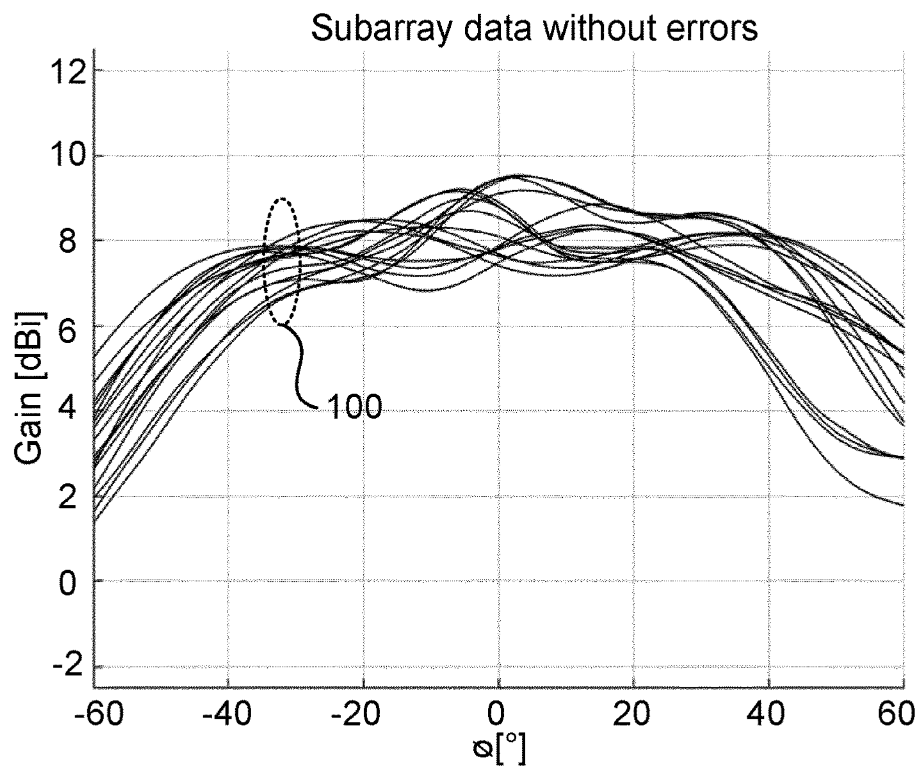
FIGS. 1-8 show simulation results according to state of the art.
Figure 2:
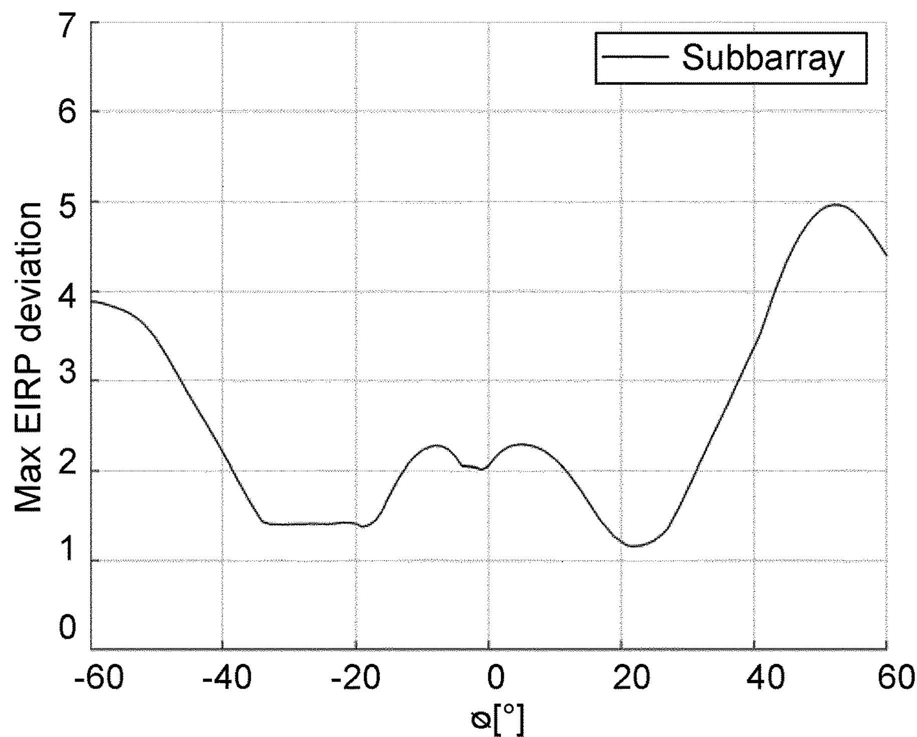
Figure 3:
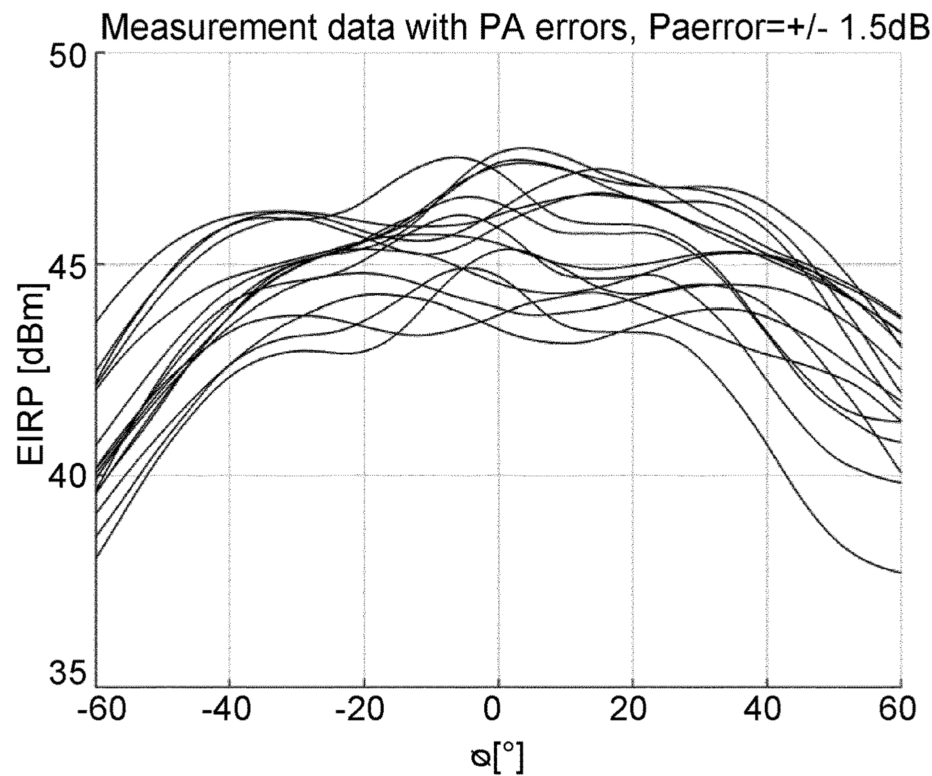
Figure 4:
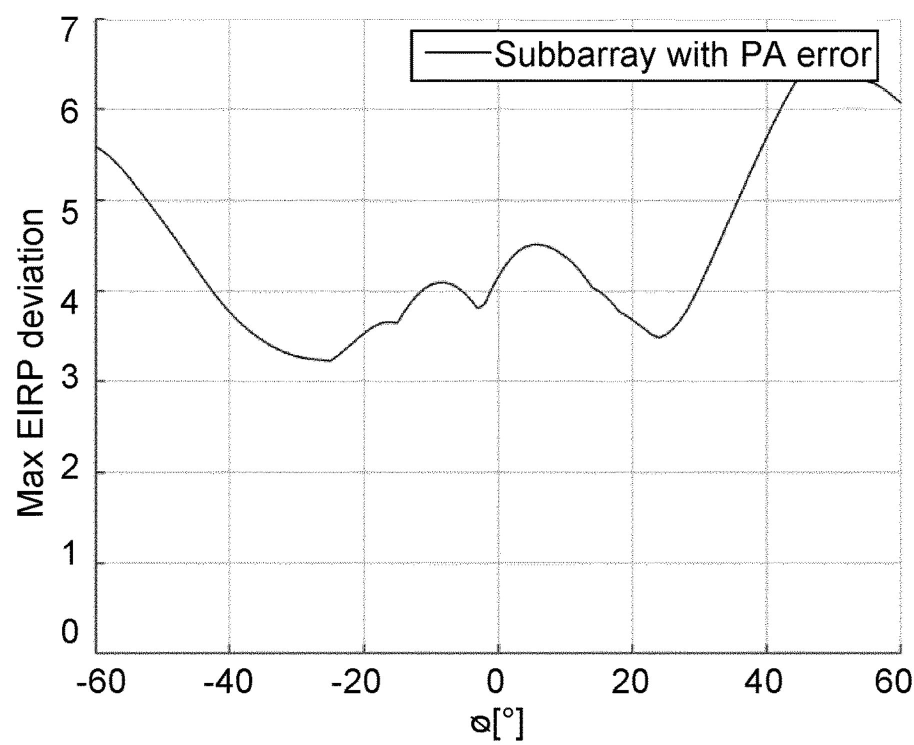
Figure 5:
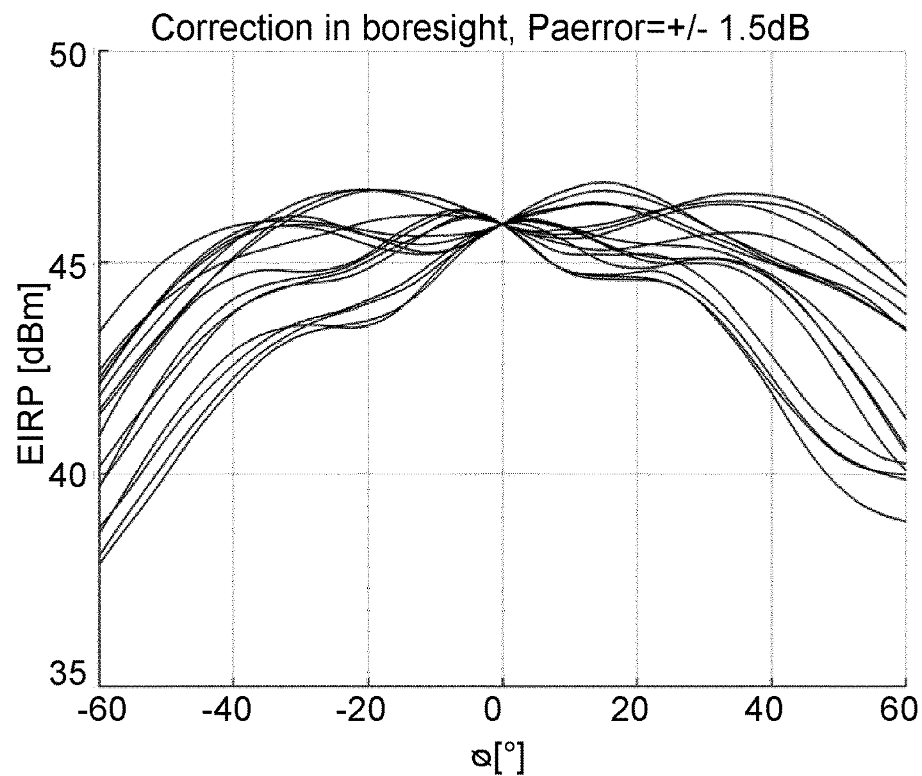
Figure 6:
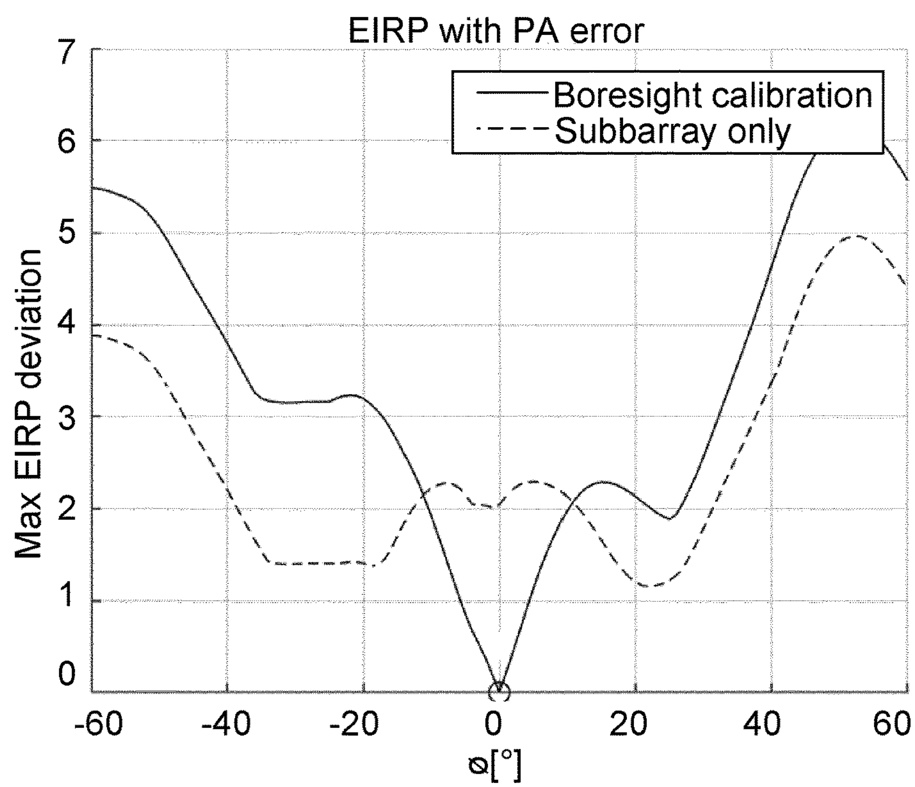
Figure 7:
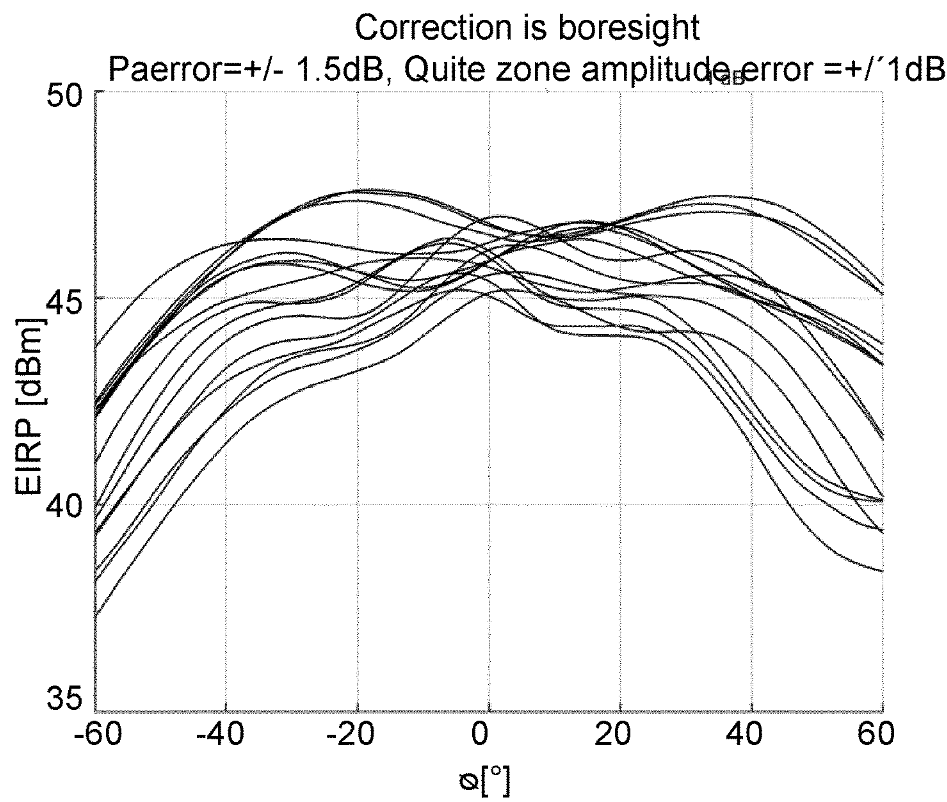
Figure 8:
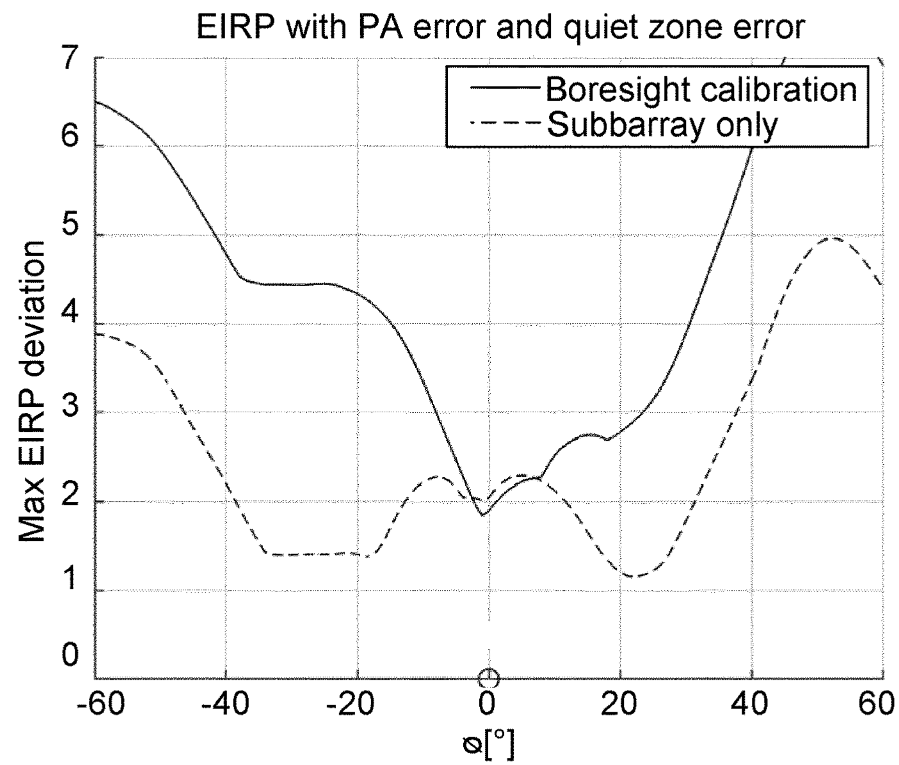

This will create a performance according to FIGS. 1 and 2 but with power amplifier errors only (i.e., without any quiet zone errors being added).

According to a second scenario the subarray antenna patterns are known to the test equipment 2400 and measurement values for each of the subarray antenna patterns are obtained from one and the same set of directions. The set of directions is composed of at least two directions within the angular interval.

That is, according to an embodiment, measurement values for each of the subarray antenna patterns are obtained from one and the same set of directions, where the set of directions is composed of at least two directions within the angular interval.

Further details of the second scenario will now be disclosed.

Using measurements in more than one direction M>1 might reduce the impact of quiet zone errors. Particularly, according to an embodiment, in terms of amplitude variation, the calibration factor value $c_{n,dB}$ for antenna branch n is determined as a function of magnitude of a received signal value of the measurement values for antenna branch n in a direction $\phi$ given by $Y_{n,dB}(\phi_{cal}{}^m)$, the amplitude-wise subarray antenna pattern for subarray n in a direction $\phi$ given by $g_{n,dB}(\phi_{cal}{}^m)$, and an amplitude-wise reference signal value given by $P_{ref,dB}$. In terms of amplitude variation, the calibration factor value $c_{n,dB}$ for antenna branch n might thus be determined by minimizing a cost function $S(c_{n,dB})$ given as (with values in dB), where the summation is to m=M:

$$S(c_{n,dB}) = \sum_{m=1}^{M} (|Y_{n,dB}(\phi_{cal}^m) + c_{n,dB} - g_{n,dB}(\phi_{cal}^m) - P_{ref,dB}|)^2$$

The calibration factor values might be solved with, for example, a least squares optimization.

Further, in terms of phase variation, the calibration factor value $c_{n,deg}$ for antenna branch n is, according to an embodiment, determined as a function of a phase-wise received signal value of the measurement values for antenna branch n in a direction $\phi$ given by $Y_{n,deg}(\phi_{cal}{}^m)$, the phase-wise subarray antenna pattern for the subarray of antenna branch n in a direction $\phi$ given by $g_{n,deg}(\phi_{cal}{}^m)$, and a phase-wise reference signal value given by $P_{ref,deg}$. Thus, in terms of phase variation, the calibration factor value $c_{n,deg}$ for antenna branch n might be determined by minimizing a cost function $S(c_{n,deg})$ given as (with values in degrees), where the summation is to m=M:

$$S(c_{n,deg}) = \sum_{m=1}^{M} (|Y_{n,deg}(\phi_{cal}^m) + c_{n,deg} - g_{n,deg}(\phi_{cal}^m) - P_{ref,deg}|)^2$$

The calibration factor values might be solved with, for example, a least squares optimization.

According to a third scenario the subarray antenna patterns are unknown to the test equipment 2400, and the measurement values are of amplitude and/or phase values in at least two directions within the angular interval. The subarray antenna patterns are then represented by these amplitude and/or phase values.

Using measurements in more than one direction M>1 might enable the average error over the angular interval to be minimized according to some arbitrary metric.

Further details of the third scenario will now be disclosed.

Particularly, according to an embodiment, in terms of amplitude variation, the calibration factor value $c_{n,dB}$ for antenna branch n is determined as a function of magnitude of a received signal value of the measurement values for antenna branch n in a direction $\phi$ given by $Y_{n,dB}(\phi_{cal}{}^{m})$ and an amplitude-wise reference signal value in a direction $\phi$ given by $Y_{ref,dB}(\phi_{cal}{}^{m})$. Thus, in terms of amplitude variation, the calibration factor value $c_{n,dB}$ for antenna branch n might be determined by minimizing a cost function $S(c_{n,dB})$ given as (with values in dB), where the summation is to m=M:

$$S(c_{n,dB}) = \sum_{m=1}^{M}(|Y_{n,dB}(\phi_{cal}^{m}) + c_{n,dB} - Y_{ref,dB}(\phi_{cal}^{m})|)^2$$

The calibration factor values might be solved with, for example, a least squares optimization. This might enable the average error over the angular interval to be minimized.

Simulation results relevant for amplitude aspects will now be presented.

Figure 11:
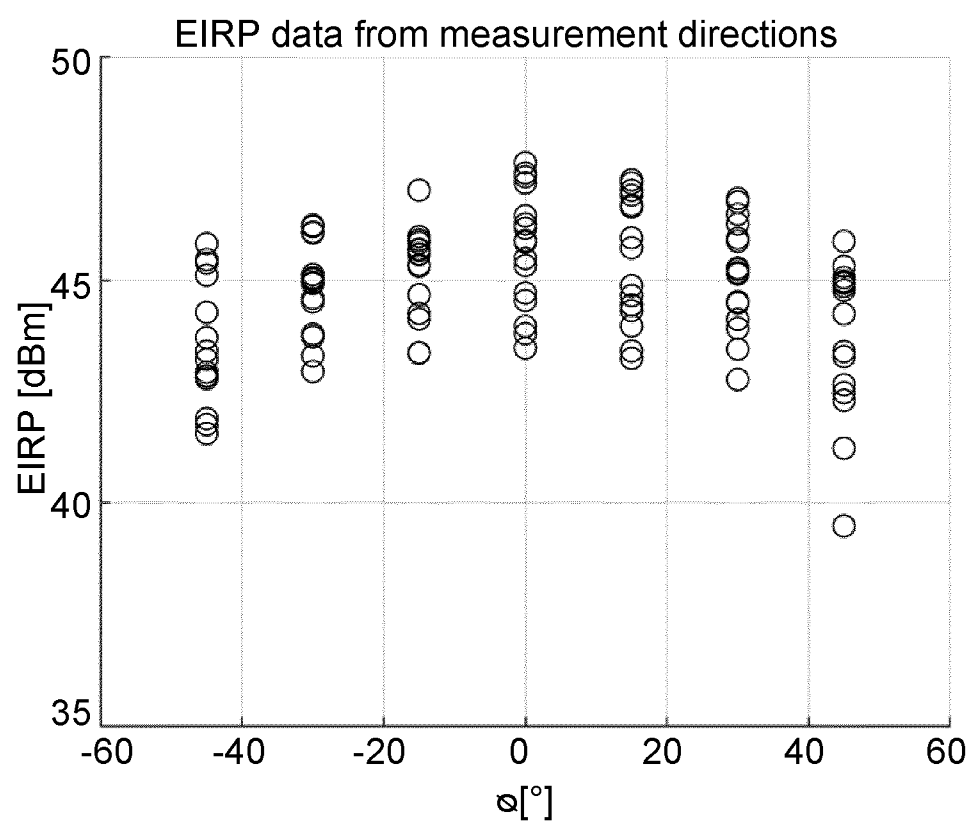
FIGS. 11-23 show simulation results according to embodiments.

FIG. 11 shows measurements results in 7 directions, for $\phi$=—45°: 15°: +45°, with power amplifier errors only (i.e., not having any quiet zone error). Such measurements might be performed for one representative unit if the variations for the different directions are systematic. The calibration factor values might be calculated from the EIRP measurements in FIG. 11 by minimizing the amplitude deviation of all directions by applying a correction factor to the individual antenna branches.

Figure 12:
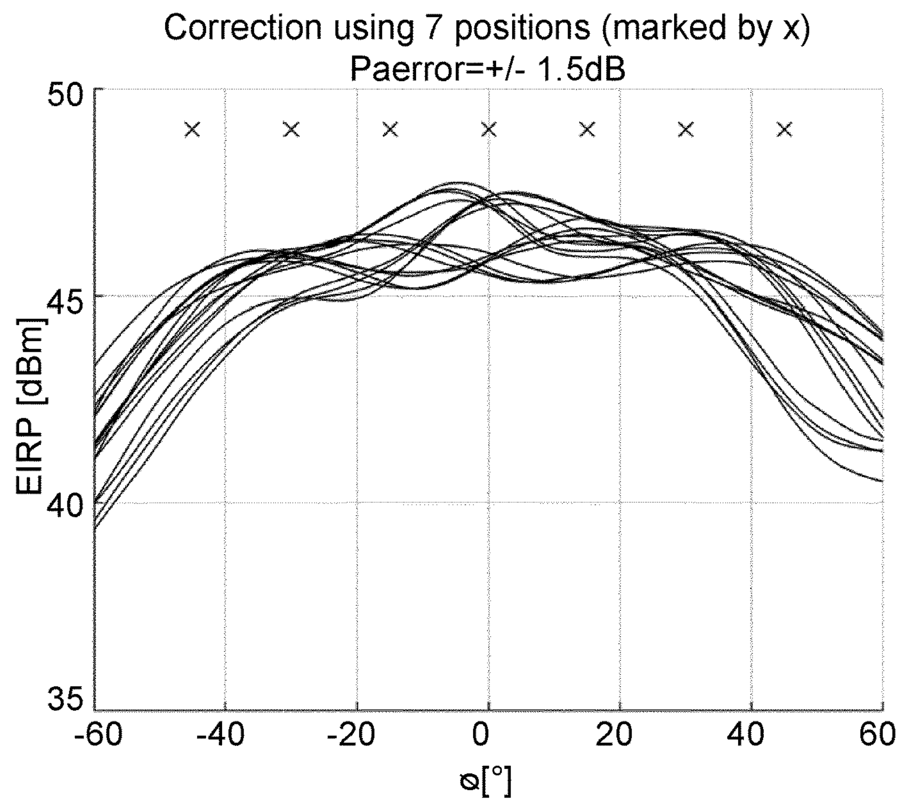
Figure 13:
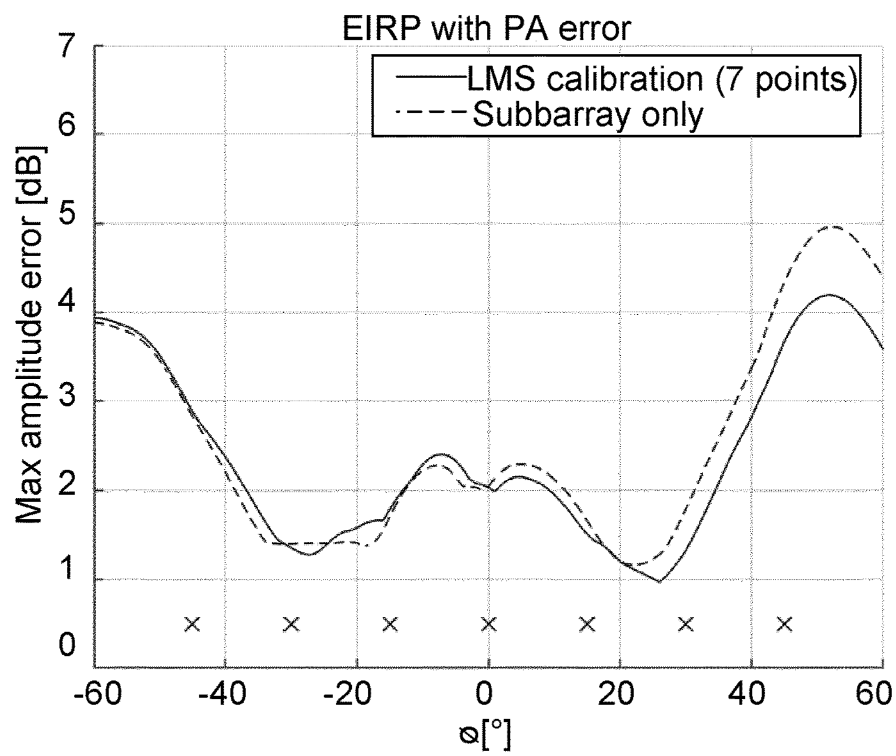

FIG. 12 shows the EIRP patterns and FIG. 13 shows the EIRP deviation after calibration in 7 directions. Here it is possible to see that the EIRP deviation is close to the original gain deviation of the subarrays i.e. an improvement compared to boresight calibration.

Figure 14:
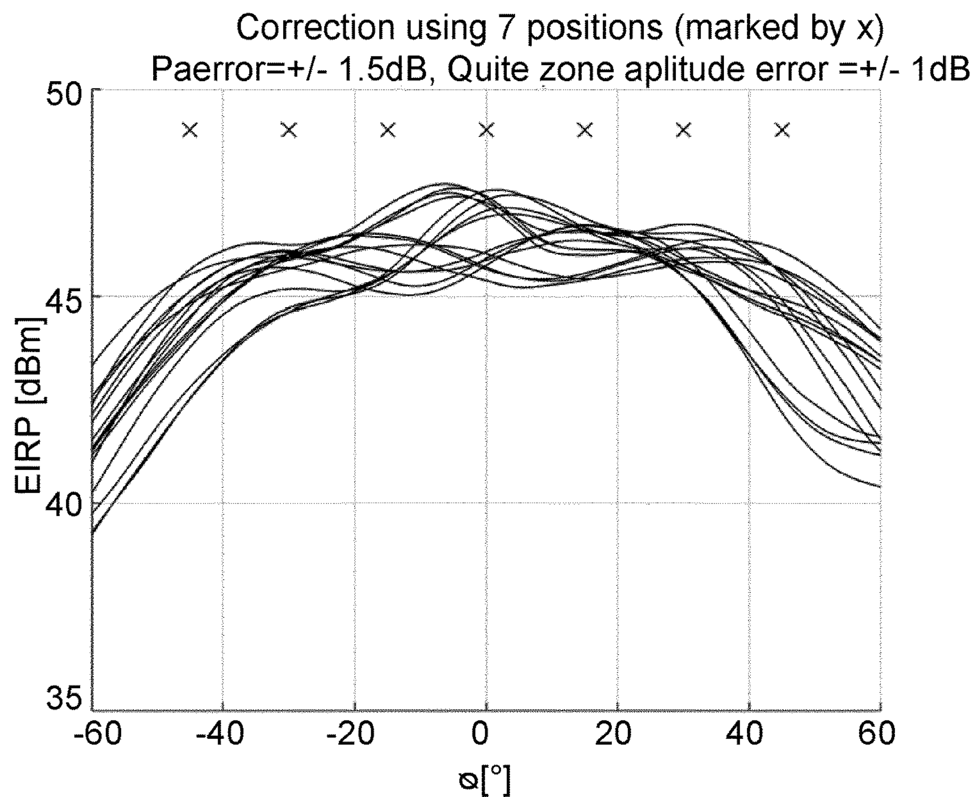
Figure 15:
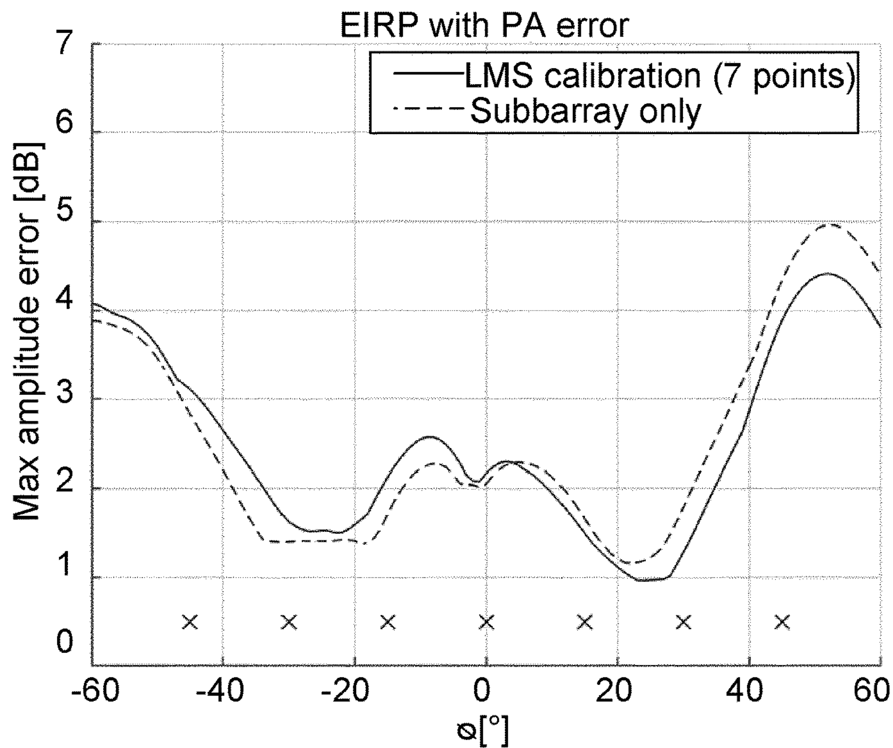

FIG. 14 and FIG. 15 show results corresponding to those in FIG. 12 and FIG. 13, respectively, but where a quiet zone amplitude error of +/−1 dB has been added.

In terms of phase variation, the calibration factor value $c_{n,deg}$ for antenna branch n is, according to an embodiment, determined as a function of a phase-wise received signal value of the measurement values for antenna branch n in a direction $\phi$ given by $Y_{n,deg}(\phi_{cal}{}^{m})$ and a phase-wise reference signal value in a direction $\phi$ given by $Y_{ref,deg}(\phi_{cal}{}^{m})$ Thus, in terms of phase variation, the calibration factor value $c_{n,deg}$ for antenna branch n might be determined by minimizing a cost function $S(c_{n,deg})$ given as (with values in dB), where the summation is to m=M:

$$S(c_{n,deg}) = \sum_{m=1}^{M}(|Y_{n,deg}(\phi_{cal}^{m}) + c_{n,deg} - Y_{ref,deg}(\phi_{cal}^{m})|)^2$$

The calibration factor values might be solved with, for example, a least squares optimization. This might enable the average error over the angular interval to be minimized.

Simulation results relevant for phase aspects will now be presented.

Figure 16:
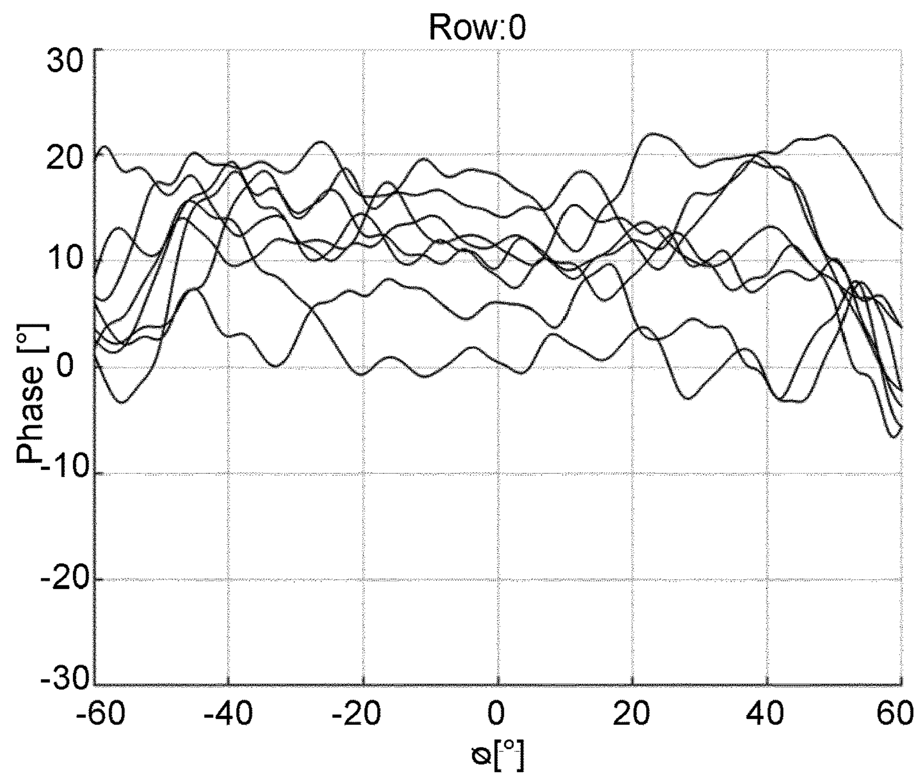

FIG. 16 shows the uncalibrated phase for an AAS 910 with N=8 subarrays and where phase centers have been moved to generate a "flat" phase over the angular interval. This can be accomplished by calculating the individual phase centers of the different subarrays and thereafter moving the subarrays.

Figure 17:
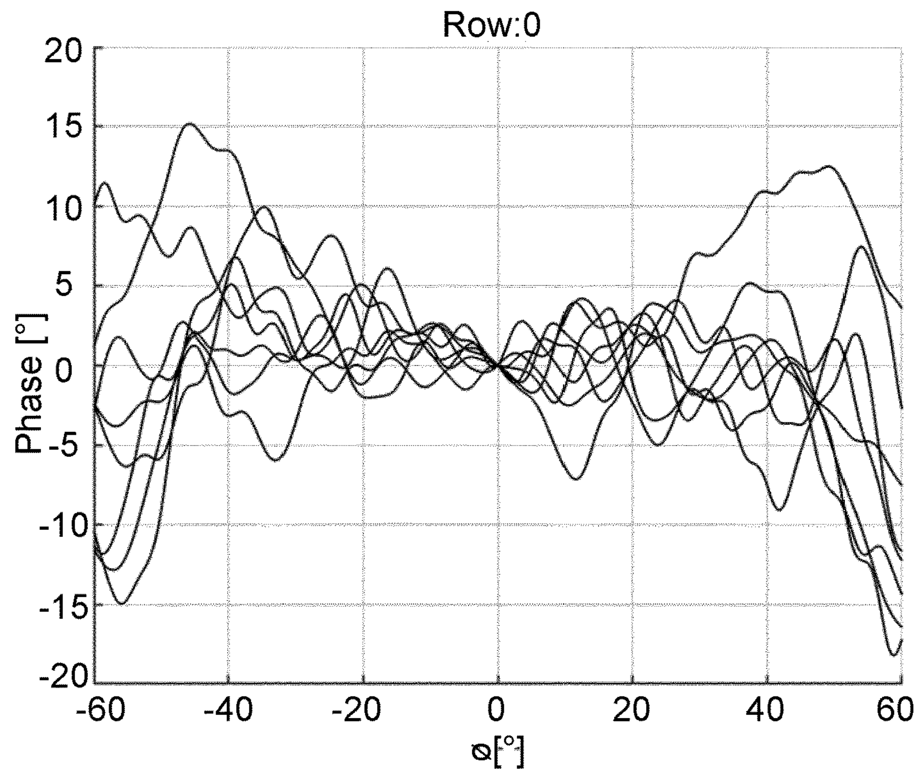

FIG. 17 shows the phase variation when the calibration is performed in boresight.

Figure 18:
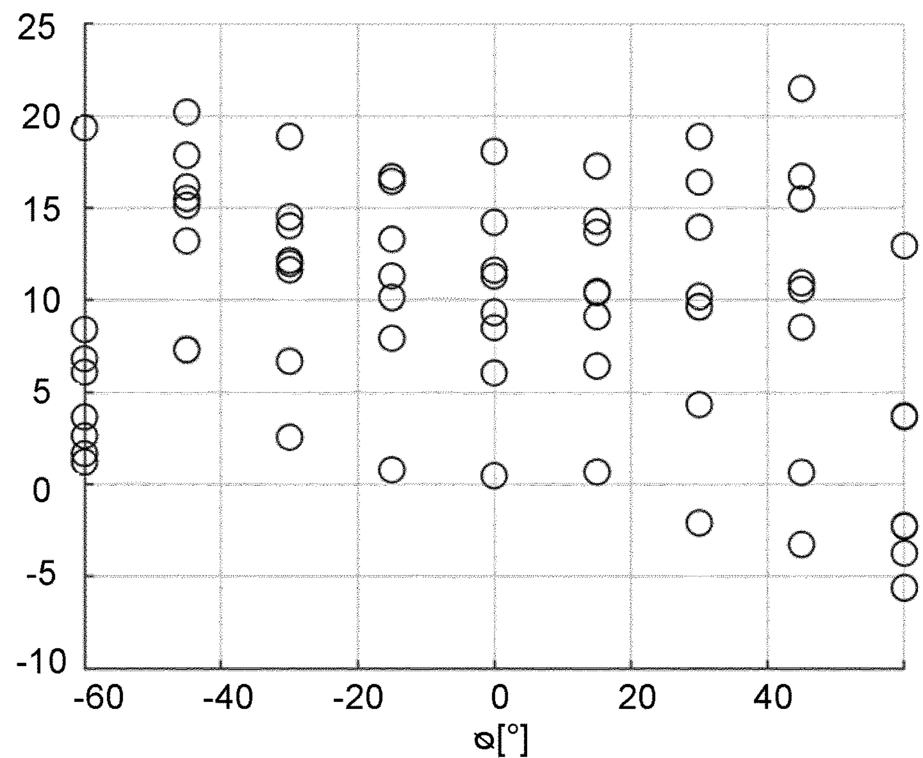

FIG. 18 shows measurements results in 9 directions for $\phi$=—60°: 15°: +60°.

Figure 19:
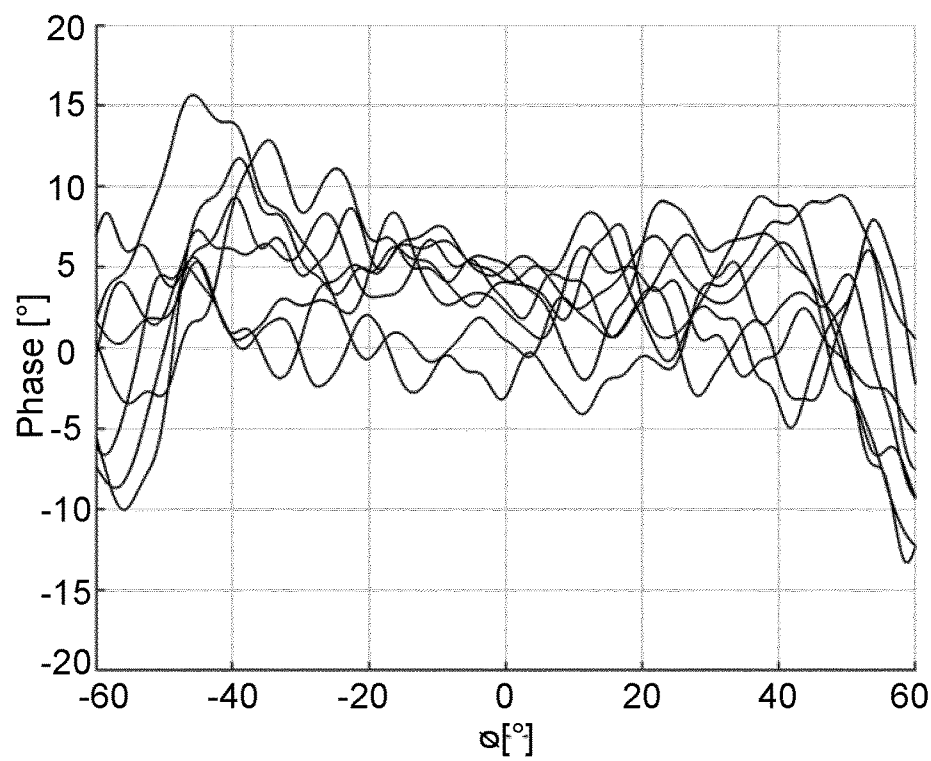

FIG. 19 shows the resulting phase error when calibration factor values resulting from least squares optimization in the 9 directions of FIG. 18 has been applied.

Figure 20:
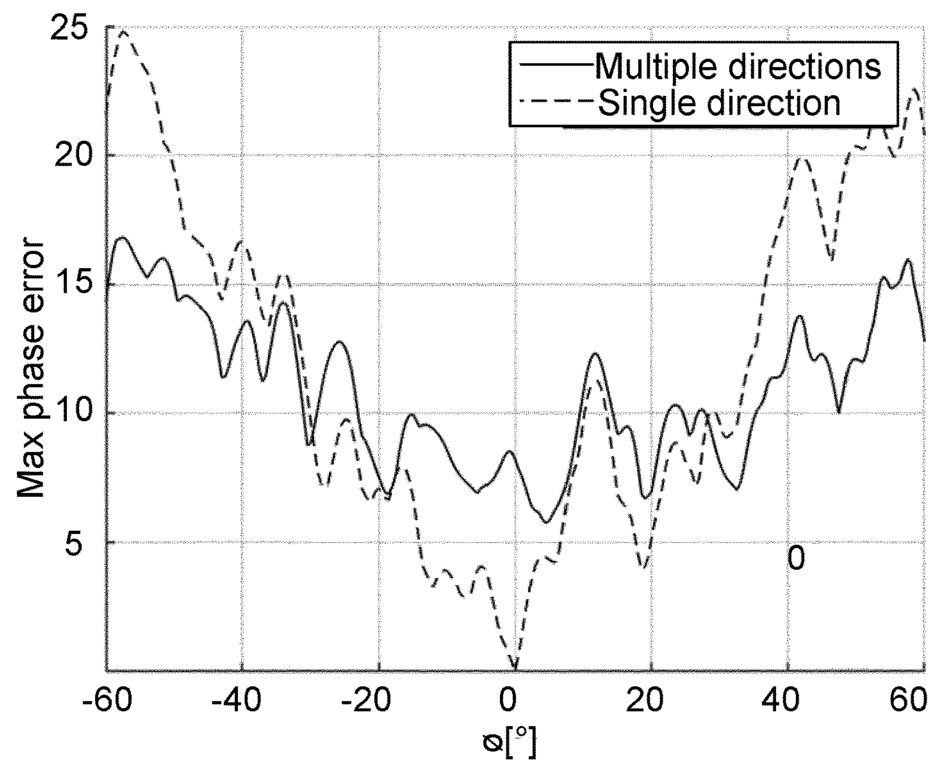

FIG. 20 compares phase error boresight calibration and calibration resulting from least squares optimization in the 9 directions of FIG. 18 has been applied.

Figure 21:
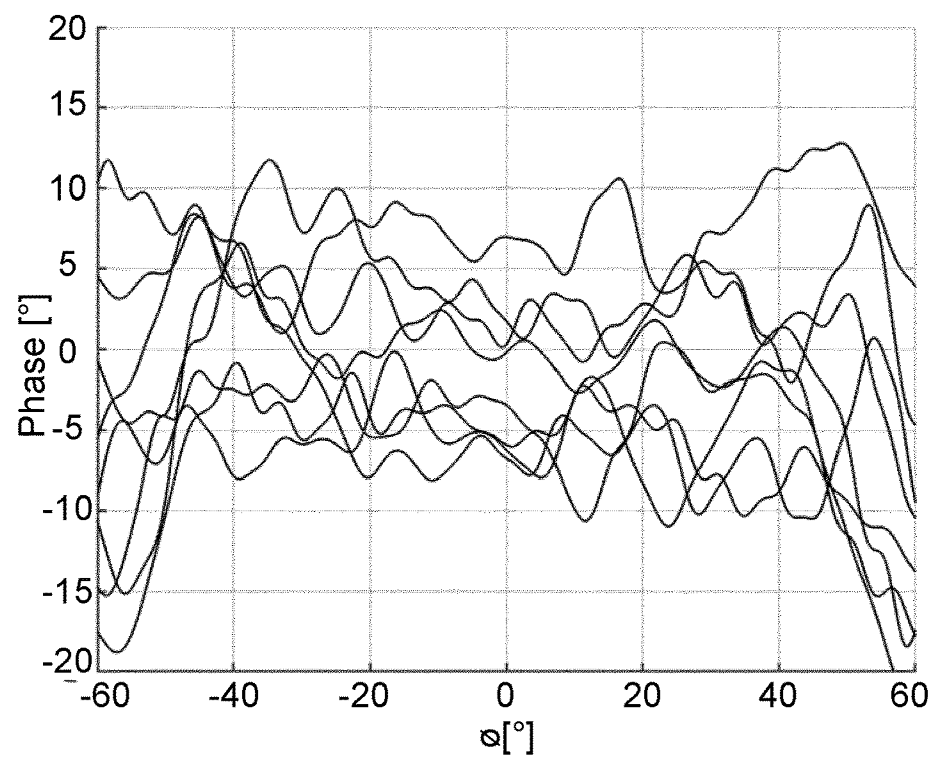
Figure 22:
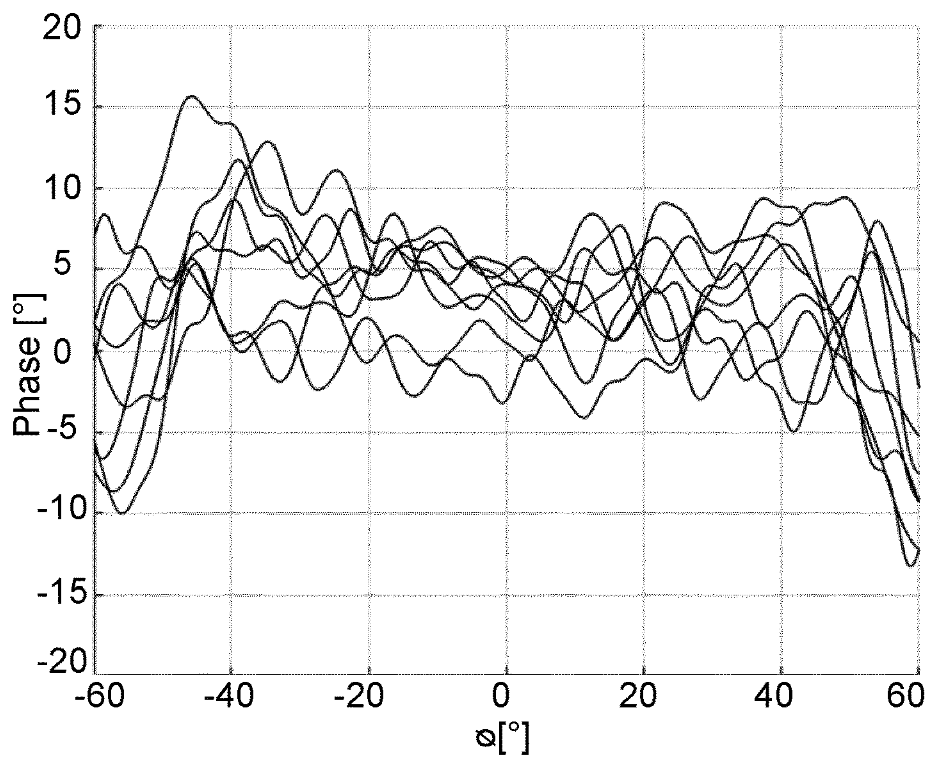
Figure 23:
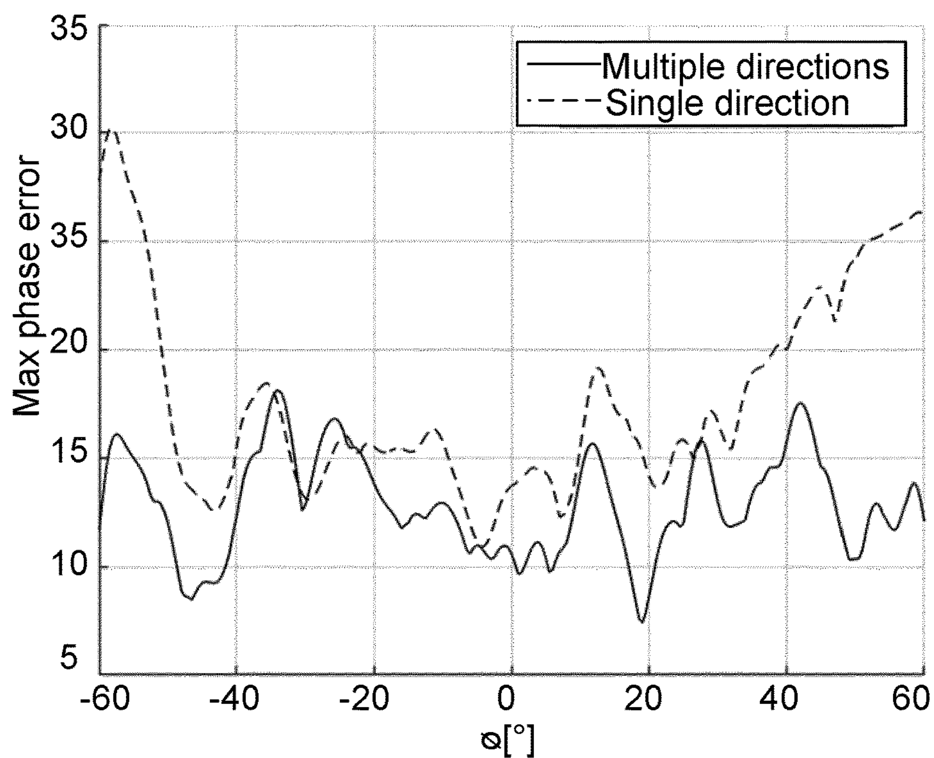

FIG. 21, FIG. 22, and FIG. 23 present results using a random uniform quiet zone phase error of +/−7.5°.

FIG. 21 shows the phase after calibration in a single direction including a random uniform quiet zone phase error of +/−7.5°.

FIG. 22 shows the phase after calibration in 9 directions (including quiet zone phase errors).

FIG. 23 compares phase error after calibration (including quiet zone phase errors) for calibration in single direction and multiple directions.

Figure 24:
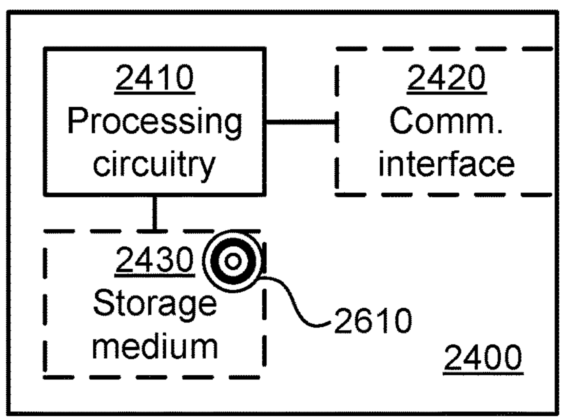
FIG. 24 is a schematic diagram showing functional units of a test equipment according to an embodiment.

FIG. 24 schematically illustrates, in terms of a number of functional units, the components of a test equipment 2400 according to an embodiment. Processing circuitry 2410 is provided using any combination of one or more of a suitable central processing unit (CPU), multiprocessor, microcontroller, digital signal processor (DSP), etc., capable of executing software instructions stored in a computer program product 2610 (as in FIG. 26), e.g. in the form of a storage medium 2430. The processing circuitry 2410 may further be provided as at least one application specific integrated circuit (ASIC), or field programmable gate array (FPGA).

Particularly, the processing circuitry 2410 is configured to cause the test equipment 2400 to perform a set of operations, or steps, as disclosed above. For example, the storage medium 2430 may store the set of operations, and the processing circuitry 2410 may be configured to retrieve the set of operations from the storage medium 2430 to cause the test equipment 2400 to perform the set of operations. The set of operations may be provided as a set of executable instructions.

Thus the processing circuitry 2410 is thereby arranged to execute methods as herein disclosed. The storage medium 2430 may also comprise persistent storage, which, for example, can be any single one or combination of magnetic memory, optical memory, solid state memory or even remotely mounted memory. The test equipment 2400 may further comprise a communications interface 2420 at least configured for communications with the AAS 910. As such the communications interface 2420 may comprise one or more transmitters and receivers, comprising analogue and digital components. The processing circuitry 2410 controls the general operation of the test equipment 2400 e.g. by sending data and control signals to the communications interface 2420 and the storage medium 2430, by receiving data and reports from the communications interface 2420, and by retrieving data and instructions from the storage medium 2430. Other components, as well as the related functionality, of the test equipment 2400 are omitted in order not to obscure the concepts presented herein.

Figure 25:
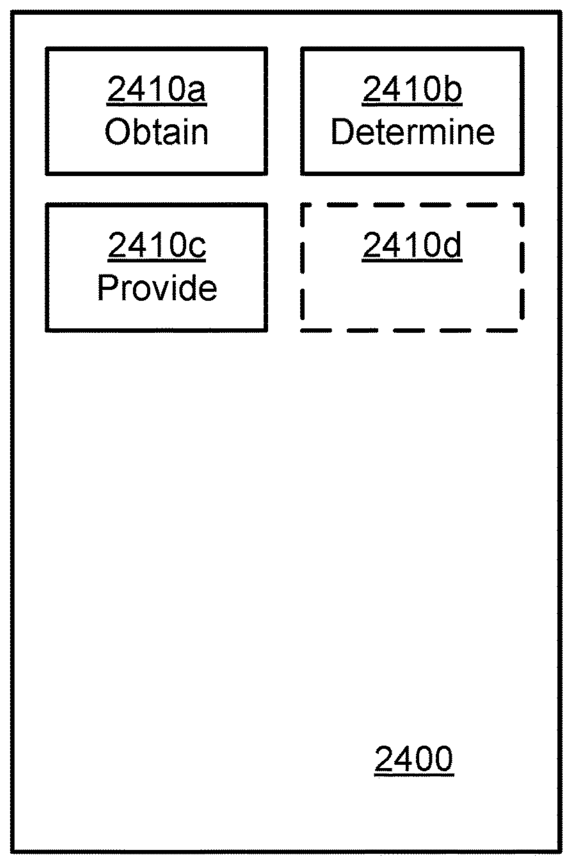
FIG. 25 is a schematic diagram showing functional modules of a test equipment according to an embodiment.

FIG. 25 schematically illustrates, in terms of a number of functional modules, the components of a test equipment 2400 according to an embodiment. The test equipment 2400 of FIG. 25 comprises a number of functional modules; an obtain module 2410*a* configured to perform step S102, a determine module 2410*b* configured to perform step S104, and a provide module 2410*c* configured to perform step S106. The test equipment 2400 of FIG. 25 may further comprise a number of optional functional modules, as represented by functional module 2410*d*. In general terms, each functional module 2410*a*-2410*d* may in one embodiment be implemented only in hardware and in another embodiment with the help of software, i.e., the latter embodiment having computer program instructions stored on the storage medium 2430 which when run on the processing circuitry makes the test equipment 2400 perform the corresponding steps mentioned above in conjunction with FIG. 25. It should also be mentioned that even though the modules correspond to parts of a computer program, they do not need to be separate modules therein, but the way in which they are implemented in software is dependent on the programming language used. Preferably, one or more or all functional modules 2410*a*-2410*d* may be implemented by the processing circuitry 2410, possibly in cooperation with the communications interface 2420 and/or the storage medium 2430. The processing circuitry 2410 may thus be configured to from the storage medium 2430 fetch instructions as provided by a functional module 2410*a*-2410*d* and to execute these instructions, thereby performing any steps as disclosed herein.

The test equipment 2400 may be provided as a standalone device or as a part of at least one further device. For example, the test equipment 2400 may be provided as part of the AAS 910. Alternatively, functionality of the test equipment 2400 may be distributed between at least two devices, or nodes.

Thus, a first portion of the instructions performed by the test equipment 2400 may be executed in a first device, and a second portion of the of the instructions performed by the test equipment 2400 may be executed in a second device; the herein disclosed embodiments are not limited to any particular number of devices on which the instructions performed by the test equipment 2400 may be executed. Hence, the methods according to the herein disclosed embodiments are suitable to be performed by a test equipment 2400 residing in a cloud computational environment. Therefore, although a single processing circuitry 2410 is illustrated in FIG. 24 the processing circuitry 2410 may be distributed among a plurality of devices, or nodes. The same applies to the functional modules 2410*a*-2410*d* of FIG. 25 and the computer program 2620 of FIG. 26.

Figure 26:
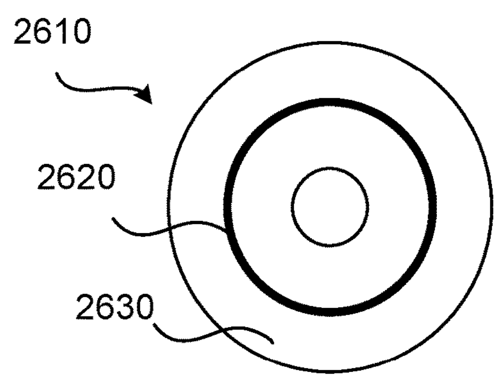
FIG. 26 shows one example of a computer program product comprising computer readable storage medium according to an embodiment.

FIG. 26 shows one example of a computer program product 2610 comprising computer readable storage medium 2630. On this computer readable storage medium 2630, a computer program 2620 can be stored, which computer program 2620 can cause the processing circuitry 2410 and thereto operatively coupled entities and devices, such as the communications interface 2420 and the storage medium 2430, to execute methods according to embodiments described herein. The computer program 2620 and/or computer program product 2610 may thus provide means for performing any steps as herein disclosed.

In the example of FIG. 26, the computer program product 2610 is illustrated as an optical disc, such as a CD (compact disc) or a DVD (digital versatile disc) or a Blu-Ray disc. The computer program product 2610 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 2620 is here schematically shown as a track on the depicted optical disk, the computer program 2620 can be stored in any way which is suitable for the computer program product 2610.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for over the air (OTA) calibration of an advanced antenna system, the advanced antenna system comprising a set of N subarrays, the set of N subarrays comprising a first subarray and a second subarray, the method being performed by a test equipment, the method comprising:

obtaining a first measurement value for the first subarray, wherein the first subarray gives rise to a first subarray antenna pattern with respect to a first direction;

determining a first calibration factor value for the first subarray using the first measurement value and the first subarray antenna pattern;

obtaining a second measurement value for the second subarray, wherein the second subarray gives rise to a second subarray antenna pattern with respect to the first direction;

determining a second calibration factor value for the second subarray using the second measurement value and the second subarray antenna pattern; and calibrating the advanced antenna system using the first calibration factor value and the second calibration factor value, wherein calibrating the advanced antenna system comprises:

applying the first calibration factor value to the first subarray; and applying the second calibration factor value to the second subarray.

2. The method of claim 1, wherein the first measurement value comprises amplitude and/or phase measurements.

3. The method of claim 1, wherein the first and second subarray antenna patterns are known to the test equipment.

4. The method of claim 3, wherein the first and second measurement values are obtained from a second direction.

5. The method of claim 4, wherein the first calibration factor value is determined based on a reference signal value the first subarray antenna pattern, and a received signal value in the first direction.

6. The method of claim 5, wherein, in terms of amplitude variation, the first calibration factor value is determined as:

$$c_{dB} = 20\log\left|\frac{Y_{ref}\cdot g}{Y}\right|$$

wherein $c_{dB}$ is the first calibration value, $Y_{ref}$ is the reference signal value, g is the first subarray pattern, and Y is the received signal value.

7. The method of claim 5, wherein, in terms of phase variation, the first calibration factor value is determined as:

$$C_{deg} = \arg\left(\frac{Y_{ref} \cdot g}{Y}\right)$$

wherein $c_{deg}$ is the first calibration value, $Y_{ref}$ is the reference signal value, g is the first subarray pattern, and Y is the received signal value.

8. The method of claim 3, wherein the first and second measurement values are obtained from a second direction and a third direction.

9. The method of claim 8, wherein, in terms of amplitude variation, the first calibration factor value is determined based on a magnitude of a received signal value of the first measurement value, an amplitude of the first subarray antenna pattern, and an amplitude of a reference signal value.

10. The method of claim 9 wherein, in terms of amplitude variation, the first calibration factor value is determined by minimizing a cost function $S(c_{dB})$ given as:

$$S(c_{dB}) = \sum_{m=1}^{M} (|Y_{dB}(\phi^m) + c_{dB} - g_{dB}(\phi^m) - P_{ref,dB}|)^2$$

wherein $(\phi^m)$ is the second direction if m=1 and the third direction if m=2, M is 2, $c_{db}$ is the first calibration value, $Y_{dB}$ is the magnitude of a received signal value of the first measurement value, $g_{dB}$ is the amplitude of the first subarray pattern, and $P_{ref,dB}$ is the amplitude of the reference signal value.

11. The method of claim 8, wherein, in terms of phase variation, the first calibration factor value is determined based on a phase of a received signal value of the first measurement value a phase of the first subarray antenna pattern, and a phase of a reference signal value.

12. The method of claim 11, wherein, in terms of phase variation, the first calibration factor value is determined by minimizing a cost function $S(c_{deg})$ given as:

$$S(c_{deg}) = \sum_{m=1}^{M} (|Y_{deg}(\phi^m) + c_{deg} - g_{deg}(\phi^m) - P_{ref,deg}|)^2$$

wherein $(\phi^m)$ is the second direction if m=1 and the third direction if m=2, M is 2, $c_{deg}$ is the first calibration value, $Y_{deg}$ is the phase of a received signal value of the first measurement value, $g_{deg}$ is the phase of the first subarray pattern, and $P_{ref,deg}$ is the phase of the reference signal value.

13. The method of claim 1, wherein the first and second subarray antenna patterns are unknown to the test equipment, and wherein the first and second measurement values include amplitude and/or phase values in at least two directions, the amplitude and/or phase values representing the subarray antenna patterns.

14. The method of claim 13, wherein, in terms of amplitude variation, the first calibration factor value is determined based on a magnitude of a received signal value of the first measurement value and an amplitude of a reference signal value.

15. The method of claim 14, wherein, in terms of amplitude variation, the first calibration factor value determined by minimizing a cost function $S(c_{dB})$ given as:

$$S(c_{dB}) = \sum_{m=1}^{M} (|Y_{dB}(\phi^m) + c_{dB} - Y_{ref,dB}(\phi^m)|)^2$$

wherein $(\phi^m)$ is the second direction if m=1 and the third direction if m=2, M is 2, $c_{dB}$ is the first calibration value, $Y_{dB}$ is the magnitude of a received signal value of the first measurement value, and $Y_{ref,dB}$ is the amplitude of the reference signal value.

16. The method of claim 13, wherein, in terms of phase variation, the first calibration factor value is determined based on a phase of a received signal value of the first measurement value and a phase of a reference signal value.

17. The method of claim 16, wherein, in terms of phase variation, the first calibration factor value is determined by minimizing a cost function $S(c_{deg})$given as:

$$S(c_{deg}) = \sum_{m=1}^{M} (|Y_{deg}(\phi^m) + c_{deg} - Y_{ref,deg}(\phi^m)|)^2$$

wherein $(\phi^m)$ is the second direction if m=1 and the third direction if m=2, M is 2, $c_{deg}$ is the first calibration value, $Y_{deg}$ is the phase of a received signal value of the first measurement value, and $Y_{ref,deg}$ is the phase of the reference signal value.

18. The method of claim 1, wherein each subarray in the set of N subarrays comprises at least one individual antenna element.

19. A test equipment for over the air (OTA) calibration of an advanced antenna system, the advanced antenna system comprising a set of N subarrays, the set of N subarrays comprising a first subarray and a second subarray, the test equipment comprising processing circuitry, the processing circuitry being configured to cause the test equipment to:

obtain a first measurement value for the first subarray, wherein the first subarray gives rise to a first subarray antenna pattern with respect to a first direction;

determine a first calibration factor value for the first subarray using the first measurement value and the first subarray antenna pattern;

obtain a second measurement value for the second subarray, wherein the second subarray gives rise to a second subarray antenna pattern with respect to the first direction;

determine a second calibration factor value for the second subarray using the second measurement value and the second subarray antenna pattern; and calibrate the advanced antenna system using the first calibration factor value and the second calibration factor value, wherein calibrating the advanced antenna system comprises:

apply the first calibration factor value to the first subarray; and apply the second calibration factor value to the second subarray.

20. A non-transitory computer readable storage medium storing a computer program for over the air (OTA) calibration of an advanced antenna system, the advanced antenna system comprising a set of N subarrays, the set of N subarrays comprising a first subarray and a second subarray the computer program comprising computer code which, when run on processing circuitry of a test equipment, causes the test equipment to:

obtain a first measurement value for the first subarray, wherein the first subarray gives rise to a first subarray antenna pattern with respect to a first direction;

determine a first calibration factor value for the first subarray using the first measurement value and the first subarray antenna pattern;

obtain a second measurement value for the second subarray, wherein the second subarray gives rise to a second subarray antenna pattern with respect to the first direction;

determine a second calibration factor value for the second subarray using the second measurement value and the second subarray antenna pattern; and calibrate the advanced antenna system using the first calibration factor value and the second calibration factor value, wherein calibrating the advanced antenna system comprises:

apply the first calibration factor value to the first subarray; and apply the second calibration factor value to the second subarray.

* * * * *